US012593568B2

(12) United States Patent
Lee et al.

(10) Patent No.: US 12,593,568 B2
(45) Date of Patent: Mar. 31, 2026

(54) METAL OVERHANG FOR ADVANCED PATTERNING

(71) Applicant: Applied Materials, Inc., Santa Clara, CA (US)

(72) Inventors: Jungmin Lee, Santa Clara, CA (US); Seong Ho Yoo, San Ramon, CA (US); Dieter Haas, San Jose, CA (US); Si Kyoung Kim, Gwangju-si (KR); Yu-hsin Lin, Zhubei (TW); Ji Young Choung, Hwaseong-si (KR)

(73) Assignee: Applied Materials, Inc., Santa Clara, CA (US)

( * ) Notice: Subject to any disclaimer, the term of this patent is extended or adjusted under 35 U.S.C. 154(b) by 424 days.

(21) Appl. No.: 18/040,161

(22) PCT Filed: Jul. 27, 2021

(86) PCT No.: PCT/US2021/043279
§ 371 (c)(1),
(2) Date: Feb. 1, 2023

(87) PCT Pub. No.: WO2022/039890
PCT Pub. Date: Feb. 24, 2022

(65) Prior Publication Data
US 2023/0269969 A1      Aug. 24, 2023

Related U.S. Application Data

(60) Provisional application No. 63/187,087, filed on May 11, 2021, provisional application No. 63/068,624, filed on Aug. 21, 2020.

(51) Int. Cl.
*H10K 59/122* (2023.01)
*H10K 59/12* (2023.01)
*H10K 59/80* (2023.01)

(52) U.S. Cl.
CPC ....... *H10K 59/122* (2023.02); *H10K 59/1201* (2023.02); *H10K 59/873* (2023.02)

(58) Field of Classification Search
CPC . H10K 59/122; H10K 59/1201; H10K 59/873
(Continued)

(56) References Cited

U.S. PATENT DOCUMENTS

2002/0014836 A1*   2/2002   Codama ............... H10K 50/844
                                                    313/506
2012/0217516 A1    8/2012   Hatano et al.
(Continued)

FOREIGN PATENT DOCUMENTS

CN          101330010 A    12/2008
CN          107180920 A    9/2017
(Continued)

OTHER PUBLICATIONS

Korean Office Action issued to patent application No. 10-2023-7009378 on Feb. 26, 2025.
(Continued)

*Primary Examiner* — Eric W Jones
(74) *Attorney, Agent, or Firm* — Patterson + Sheridan, LLP

(57) ABSTRACT

Sub-pixel circuits and methods of forming sub-pixel circuits that may be utilized in an organic light-emitting diode (OLED) display are described herein. The adjacent metal-containing overhang structures defining each sub-pixel of the sub-pixel circuit of the display provide for formation of the sub-pixel circuit using evaporation deposition and provide for the metal-containing overhang structures to remain in place after the sub-pixel circuit is formed (e.g., utilizing the methods of the fifth, sixth, or seventh exemplary embodiments). Evaporation deposition may be utilized for deposition of an OLED material and cathode. The metal-
(Continued)

containing overhang structures define deposition angles, i.e., provide for a shadowing effect during evaporation deposition. The encapsulation layer of a respective sub-pixel is disposed over the cathode with the encapsulation layer extending under at least a portion of each of the adjacent metal-containing overhang structures and along a sidewall of each of the adjacent metal-containing overhang structures.

20 Claims, 8 Drawing Sheets

(58) Field of Classification Search
USPC ............................................. 257/40, 59, 99
See application file for complete search history.

(56) References Cited

U.S. PATENT DOCUMENTS

| | | | | |
|---|---|---|---|---|
| 2012/0228603 A1* | 9/2012 | Nakamura | ........... | H10K 50/824 257/40 |
| 2014/0191203 A1 | 7/2014 | Son et al. | | |

| | | | | |
|---|---|---|---|---|
| 2017/0077194 A1 | 3/2017 | Liu et al. | | |
| 2020/0161394 A1* | 5/2020 | Jeon | ...................... | H10K 59/122 |
| 2020/0312930 A1* | 10/2020 | Choi | ....................... | H10K 50/19 |
| 2021/0135150 A1* | 5/2021 | Wang | .................... | H10K 71/00 |

FOREIGN PATENT DOCUMENTS

| | | | |
|---|---|---|---|
| CN | 109509772 A | 3/2019 |
| EP | 1476001 A2 | 11/2004 |
| JP | 2000195677 A | 7/2000 |
| WO | 2008132655 A2 | 11/2008 |

OTHER PUBLICATIONS

International Search Report/ Written Opinion issued to PCT/US2021/043279 on Nov. 18, 2021.

Japanese Office Action issued to Patent Application No. 2023-511918 on Jan. 16, 2024.

Korean Office Action issued to patent application No. 10-2023-7009378 on Nov. 4, 2025.

Office Action for Chinese Application No. 202180054951.5 mailed Oct. 25, 2025.

* cited by examiner

300

301 DISPOSE FIRST RESIST

302 DISPOSE METAL-CONTAINING BONDING LAYER

303 DISPOSE SECOND RESIST

304 FORM METAL-CONTAINING OVERHANG STRUCTURES

305 REMOVE THE FIRST RESIST

306 ETCH TOP SURFACE OF THE METAL-CONTAINING OVERHANG STRUCTURES

307 REMOVE THE SECOND RESIST

308 DEPOSIT OLED MATERIAL, CATHODE, AND ENCAPSULATION LAYER

309 DISPOSE INKJET LAYER AND GLOBAL PASSIVATION LAYER

METAL OVERHANG FOR ADVANCED PATTERNING

BACKGROUND

Field

Embodiments described herein generally relate to a display. More specifically, embodiments described herein relate to sub-pixel circuits and methods of forming sub-pixel circuits that may be utilized in a display such as an organic light-emitting diode (OLED) display.

Description of the Related Art

Input devices including display devices may be used in a variety of electronic systems. An organic light-emitting diode (OLED) is a light-emitting diode (LED) in which the emissive electroluminescent layer is a film of an organic compound that emits light in response to an electric current. OLED devices are classified as bottom emission devices if light emitted passes through the transparent or semi-transparent bottom electrode and substrate on which the panel was manufactured. Top emission devices are classified based on whether or not the light emitted from the OLED device exits through the lid that is added following the fabrication of the device. OLEDs are used to create display devices in many electronics today. Today's electronics manufacturers are pushing these display devices to shrink in size while providing higher resolution than just a few years ago.

OLED pixel patterning is currently based on a process that restricts panel size, pixel resolution, and substrate size. Rather than utilizing a fine metal mask, photo lithography should be used to pattern pixels. Currently, OLED pixel patterning requires lifting off organic material after the patterning process. When lifted off, the organic material leaves behind a particle issue that disrupts OLED performance. Accordingly, what is needed in the art are sub-pixel circuits and methods of forming sub-pixel circuits to increase pixel-per-inch and provide improved OLED performance.

SUMMARY

In one embodiment, a device is provided. The device includes a substrate, adjacent pixel-defining layer (PDL) structures disposed over the substrate and defining sub-pixels of the device, metal-containing overhang structures disposed over an upper surface of the PDL structures, and a plurality of sub-pixels. Each sub-pixel includes an anode, an organic light-emitting diode (OLED) material disposed over and in contact with the anode, and a cathode disposed over the OLED material. The metal-containing overhang structures disposed over the upper surface of the PDL structure extend over a portion of the OLED material and the cathode.

In another embodiment, a device is provided. The device includes a plurality of sub-pixels, each sub-pixel of the plurality of sub-pixels defined by adjacent pixel-defining layer (PDL) structures with metal-containing overhang structures disposed over the PDL structures, each sub-pixel having an anode, organic light-emitting diode (OLED) material disposed on the anode, and a cathode disposed over the OLED material. The device is made by a process including depositing the OLED material using evaporation deposition over a substrate, the OLED material disposed over and in contact with the anode, the OLED material having an OLED edge defined by defined by adjacent overhangs of the metal-containing overhang structures, and depositing a cathode using evaporation deposition, wherein the metal-containing overhang structures disposed over the PDL structure extend over a portion of the OLED material and the cathode.

In yet another embodiment, a method is provided. The method includes disposing a first resist in a pixel opening and over exterior portions of adjacent PDL structures, the adjacent PDL structures disposed over a substrate, disposing a second resist on the first resist between the exterior portions of the adjacent PDL structures, plating a metal-containing material over an area defined by the first resist and the second resist, and removing the second resist and the first resist to form metal-containing overhang structures disposed on the adjacent PDL structure.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figures 1A, 1B:
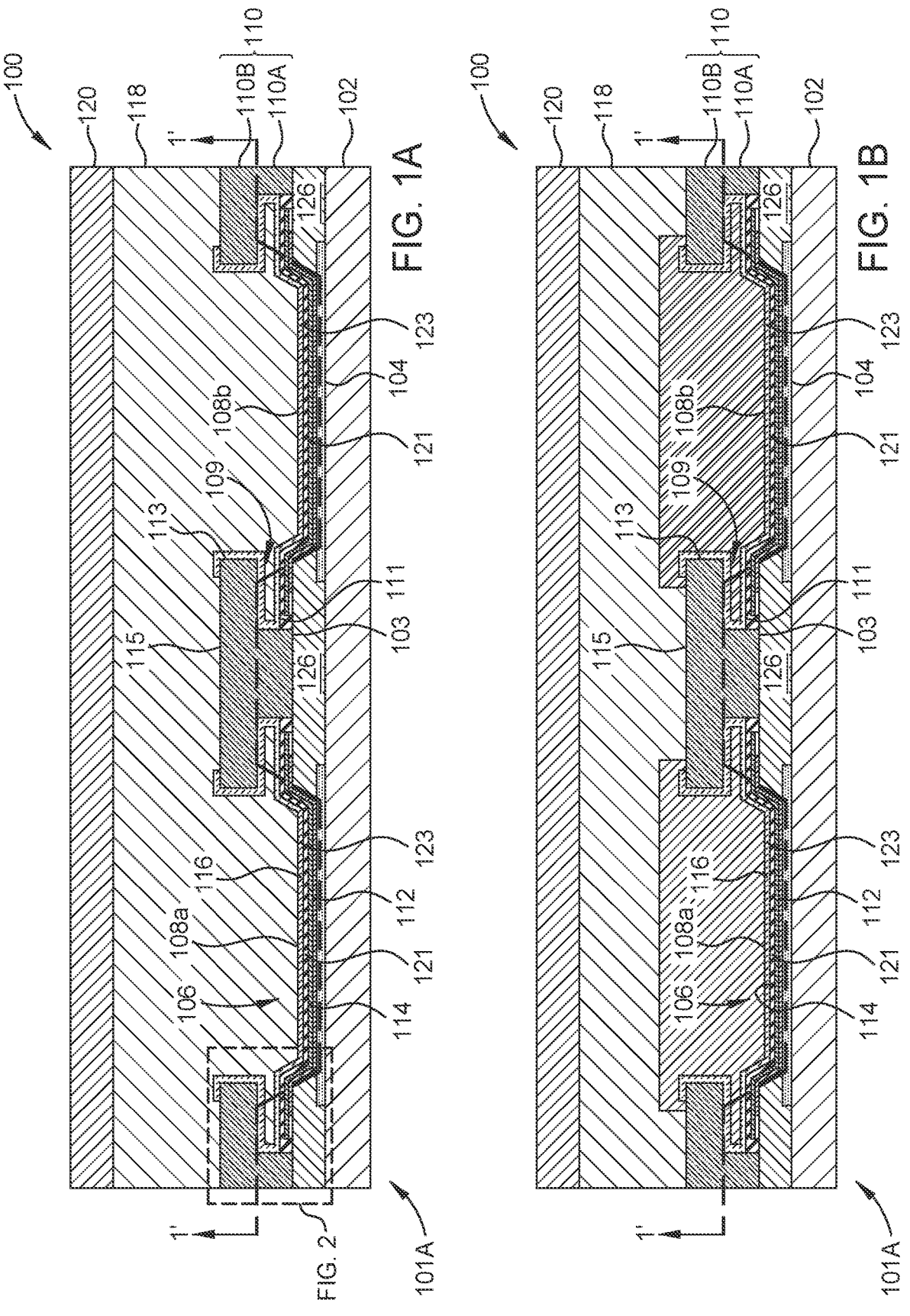
FIGS. 1A and 1B are schematic, cross-sectional views of a sub-pixel circuit according to embodiments.

Embodiments described herein generally relate to a display. More specifically, embodiments described herein relate to sub-pixel circuits and methods of forming sub-pixel circuits that may be utilized in a display such as an organic light-emitting diode (OLED) display. In one embodiment, which can be combined with other embodiments described herein, the display is a bottom emission (BE) or a top emission (TE) OLED display. In another embodiment, which can be combined with other embodiments described herein, the display is a passive-matrix (PM) or an active matrix (AM) OLED display.

A first exemplary embodiment of the embodiments described herein includes a sub-pixel circuit having a dot-type architecture. A second exemplary embodiment of the embodiments described herein includes a sub-pixel circuit having a line-type architecture. A third exemplary embodiment of the embodiments described herein includes a sub-pixel circuit having a dot-type architecture with a plug disposed on an encapsulation layer of a respective sub-pixel. A fourth exemplary embodiment of the embodiments described herein includes a sub-pixel circuit having a line-type architecture with a plug disposed on an encapsulation layer of a respective sub-pixel.

Each of the embodiments described herein of the sub-pixel circuit include a plurality of sub-pixels with each of the sub-pixels defined by adjacent metal-containing overhang structures that are permanent to the sub-pixel circuit. While the Figures depict two sub-pixels with each sub-pixel defined by adjacent metal-containing overhang structures, the sub-pixel circuit of the embodiments described herein include a plurality of sub-pixels, such as two or more sub-pixels. Each sub-pixel has the OLED material configured to emit a white, red, green, blue or other color light when energized. E.g., the OLED material of a first sub-pixel emits a red light when energized, the OLED material of a second sub-pixel emits a green light when energized, and the OLED material of a third sub-pixel emits a blue light when energized.

The adjacent metal-containing overhang structures defining each sub-pixel of the sub-pixel circuit of the display provide for formation of the sub-pixel circuit using evaporation deposition and provide for the metal-containing overhang structures to remain in place after the sub-pixel circuit is formed. Evaporation deposition may be utilized for deposition of an OLED material (including a hole injection layer (HIL), a hole transport layer (HTL), an emissive layer (EML), and an electron transport layer (ETL)) and cathode. One or more of an encapsulation layer, the plug, and a global passivation layer may be disposed via evaporation deposition. The metal-containing overhang structures extend over a portion of the OLED material and the cathode of the sub-pixels. The metal-containing overhang structures define deposition angles, i.e., provide for a shadowing effect during evaporation deposition, for each of the OLED material and the cathode such the OLED material does not contact the metal-containing overhang structures and the cathode at least a portion of a sidewall of the metal-containing overhang structures. The encapsulation layer of a respective sub-pixel is disposed over the cathode with the encapsulation layer extending under at least a portion of each of the adjacent metal-containing overhang structures and along a sidewall of each of the adjacent metal-containing overhang structures.

FIG. 1A is a schematic, cross-sectional view of a sub-pixel circuit 100 having a plugless arrangement 101A. The plugless arrangement 101A may correspond to the first or second exemplary embodiments of the sub-pixel circuit 100. FIG. 1B is a schematic, cross-sectional view of a sub-pixel circuit 100 having a plug arrangement 101B. The plug arrangement 101B may correspond to the third or fourth exemplary embodiments of the sub-pixel circuit 100. Each of the cross-sectional views of FIGS. 1A and 1B are taken along section line 1"-1" of FIGS. 1C and 1D.

The sub-pixel circuit 100 includes a substrate 102. Metal layers 104 may be patterned on the substrate 102 and are defined by adjacent pixel-defining layer (PDL) structures 126 disposed on the substrate 102. In one embodiment, which can be combined other embodiments described herein, the metal layers 104 are pre-patterned on the substrate 102. E.g., the substrate 102 is a pre-patterned indium tin oxide (ITO) glass substrate. The metal layers 104 are configured to operate anodes of respective sub-pixels. The metal layers 104 include, but are not limited to, chromium, titanium, gold, silver, copper, aluminum, ITO, or combinations thereof, or other suitably conductive materials.

The PDL structures 126 are disposed on the substrate 102. The PDL structures 126 include one of an organic material, an organic material with an inorganic coating disposed thereover, or an inorganic material. The organic material of the PDL structures 126 includes, but is not limited to, polyimides. The inorganic material of the PDL structures 126 includes, but is not limited to, silicon oxide ($SiO_2$), silicon nitride ($Si_3N_4$), silicon oxynitride (SiON), magnesium fluoride ($MgF_2$), or combinations thereof. Adjacent PDL structures 126 define a respective sub-pixel and expose the anode (i.e., metal layer 104) of the respective sub-pixel of the sub-pixel circuit 100.

The sub-pixel circuit 100 has a plurality of sub-pixels 106 including at least a first sub-pixel 108a and a second sub-pixel 108b. While the Figures depict the first sub-pixel 108a and the second sub-pixel 108b. The sub-pixel circuit 100 of the embodiments described herein may include two or more sub-pixels 106, such as a third and a fourth sub-pixel. Each sub-pixel 106 has an OLED material 112 configured to emit a white, red, green, blue or other color light when energized. E.g., the OLED material 112 of the first sub-pixel 108a emits a red light when energized, the OLED material of the second sub-pixel 108b emits a green light when energized, the OLED material of a third sub-pixel emits a blue light when energized, and the OLED material of a fourth sub-pixel emits a other color light when energized Metal-containing overhang structures 110 are disposed on an upper surface 103 of each of the PDL structures 126. The metal-containing overhang structures 110 are permanent to the sub-pixel circuit. The metal-containing overhang structures 110 further define each sub-pixel 106 of the sub-pixel circuit 100. The metal-containing overhang structures 110 include a metal-containing material. The metal-containing material includes, but is not limited to, copper, titanium, aluminum, molybdenum, silver, indium tin oxide, indium zinc oxide, or combinations thereof. The upper portion 110B is wider than the lower portion 110A to form an overhang 109. The overhang 109 allows for the upper portion 110B to shadow the lower portion 110A. The shadowing of the overhang 109 provides for evaporation deposition each of the OLED material 112 and a cathode 114.

Figure 2:
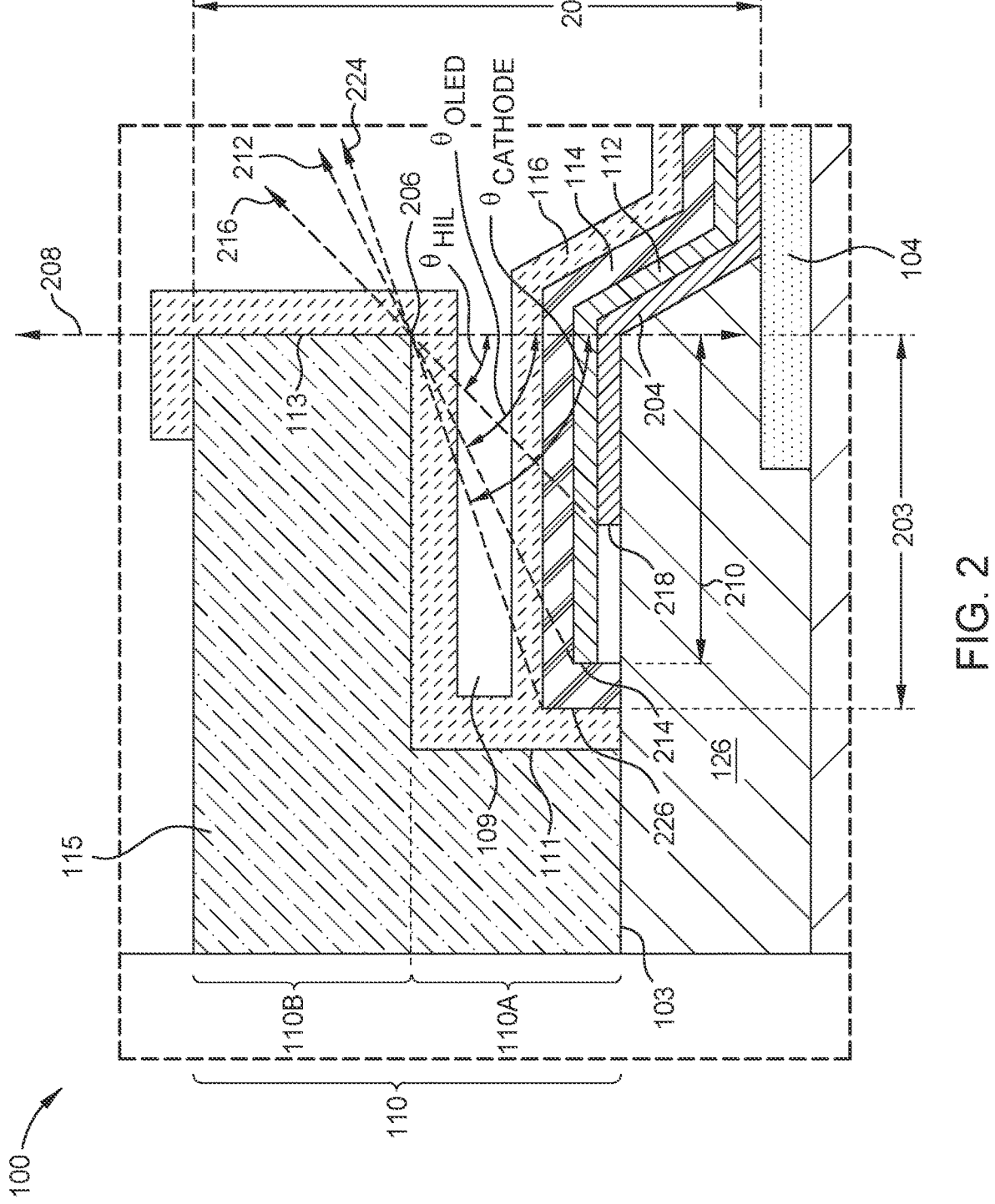
FIG. 2 is a schematic, cross-sectional view of a metal-containing overhang structure according to embodiments.

As further discussed in the corresponding description of FIG. 2, the shadowing effect of the metal-containing overhang structures 110 define a OLED angle $\theta_{OLED}$ (shown in FIG. 2) of the OLED material 112 and a cathode angle $\theta_{cathode}$ (shown in FIG. 2) of the cathode 114. The OLED angle $\theta_{OLED}$ of the OLED material 112 and the cathode angle $\theta_{cathode}$ of the cathode 114 may result from evaporation deposition of the OLED material 112 and the cathode 114. The OLED material 112 does not contact the lower portion 110A of the metal-containing overhang structures 110. In some embodiments, which can be combined with other embodiments described herein, e.g., as shown in FIG. 2, the cathode 114 does not contact the lower portion 110A of the metal-containing overhang structures 110. In other embodiments, which can be combined with other embodiments described herein, e.g., as shown in FIGS. 1A, 1B, and FIG. 4G, the cathode 114 contacts the lower portion 110A of the metal-containing overhang structures 110.

The OLED material 112 may include one or more of a HIL, a HTL, an EML, and an ETL. The OLED material 112 is disposed on the metal layer 104. In some embodiments, which can be combined with other embodiments described herein, the OLED material 112 is disposed on the metal layer 104 and over a portion of the PDL structures 126. The cathode 114 is disposed over the OLED material 112 of the PDL structures 126 in each sub-pixel 106. The cathode 114 may be disposed on a portion of a sidewall 111 of the lower portion 110A. The cathode 114 includes a conductive material, such as a metal. E.g., the cathode 114 includes, but is not limited to, magnesium-silver alloy, titanium, aluminum, ITO, or combinations thereof. In some embodiments, which can be combined with other embodiments described herein, the OLED material 112 and the cathode 114 are disposed over a sidewall 113 of the upper portion 110B of the metal-containing overhang structures 110. In other embodiments, which can be combined with other embodiments described herein, the OLED material 112 and the cathode 114 are disposed over a top surface 115 of the upper portion 110B of the metal-containing overhang structures 110.

Each sub-pixel 106 includes include an encapsulation layer 116. The encapsulation layer 116 may be or may correspond to a local passivation layer. The encapsulation layer 116 of a respective sub-pixel is disposed over the cathode 114 (and OLED material 112) with the encapsulation layer 116 extending under at least a portion of each of the metal-containing overhang structures 110 and along a sidewall of each of the metal-containing overhang structures 110. The encapsulation layer 116 is disposed over the cathode 114 and over at least the sidewall 111 of the lower portion 110A. In some embodiments, which can be combined with other embodiments described herein, the encapsulation layer 116 is disposed over the sidewall 113 of the upper portion 110B. In some embodiments, which can be combined with other embodiments described herein, the encapsulation layer 116 is disposed over the top surface 115 of the upper portion 110B of the metal-containing overhang structures 110. The encapsulation layer 116 includes the non-conductive inorganic material, such as a silicon-containing material. The silicon-containing material may include $Si_3N_4$ containing materials.

In embodiments including one or more capping layers, the capping layers are disposed between the cathode 114 and the encapsulation layer 116. E.g., as shown in FIG. 1A, a first capping layer 121 and a second capping layer 123 are disposed between the cathode 114 and the encapsulation layer 116. While FIG. 1A depicts the sub-pixel circuit 100 having one or more capping layers, each of the embodiments described herein may include one or more capping layers disposed between the cathode 114 and the encapsulation layer 116. The first capping layer 121 may include an organic material. The second capping layer 123 may include an inorganic material, such as lithium fluoride. The first capping layer 121 and the second capping layer 123 may be deposited by evaporation deposition.

The plugless arrangement 101A and the plug arrangement 101B of the sub-pixel circuit 100 further include at least a global passivation layer 120 disposed over the metal-containing overhang structures 110 and the encapsulation layers 116. An inkjet layer 118 may be disposed between the global passivation layer 120 and the metal-containing overhang structures 110 and the encapsulation layers 116. The inkjet layer 118 may include an acrylic material. The plug arrangement 101B (including the third and fourth exemplary embodiments) may include an intermediate passivation layer disposed over the metal-containing overhang structures 110 and plugs 122 of each of the sub-pixels 106, and disposed between the inkjet layer 118 and the global passivation layer 120.

The plug arrangement 101B, including the third and fourth exemplary embodiments, includes plugs 122 disposed over the encapsulation layers 116. Each plug 122 is disposed in a respective sub-pixel 106 of the sub-pixel circuit 100. The plugs 122 may be disposed over the top surface 115 of the upper portion 110B of the metal-containing overhang structures 110. The plugs 122 may have an additional passivation layer disposed thereon (as shown in FIG. 4Q). The plugs 122 include, but are not limited to, a photoresist, a color filter, or a photosensitive monomer. The plugs 122 have a plug transmittance that is matched or substantially matched to an OLED transmittance of the OLED material 112. The plugs 122 may each be the same material and match the OLED transmittance. The plugs 122 may be different materials that match the OLED transmittance of each respective sub-pixel of the plurality of sub-pixels 106. The matched or substantially matched resist transmittance and OLED transmittance allow for the plugs 122 to remain over the sub-pixels 106 without blocking the emitted light from the OLED material 112. The plugs 122 are able to remain in place and thus do not require a lift off procedure to be removed from the sub-pixel circuit 100. Additional pattern resist materials disposed over the formed sub-pixels 106 at subsequent operations are not required because the plugs 122 remain. Eliminating the need for a lift-off procedure on the plugs 122 and the need for additional pattern resist materials on the sub-pixel circuit 100 increases throughput.

Figures 1C, 1D:
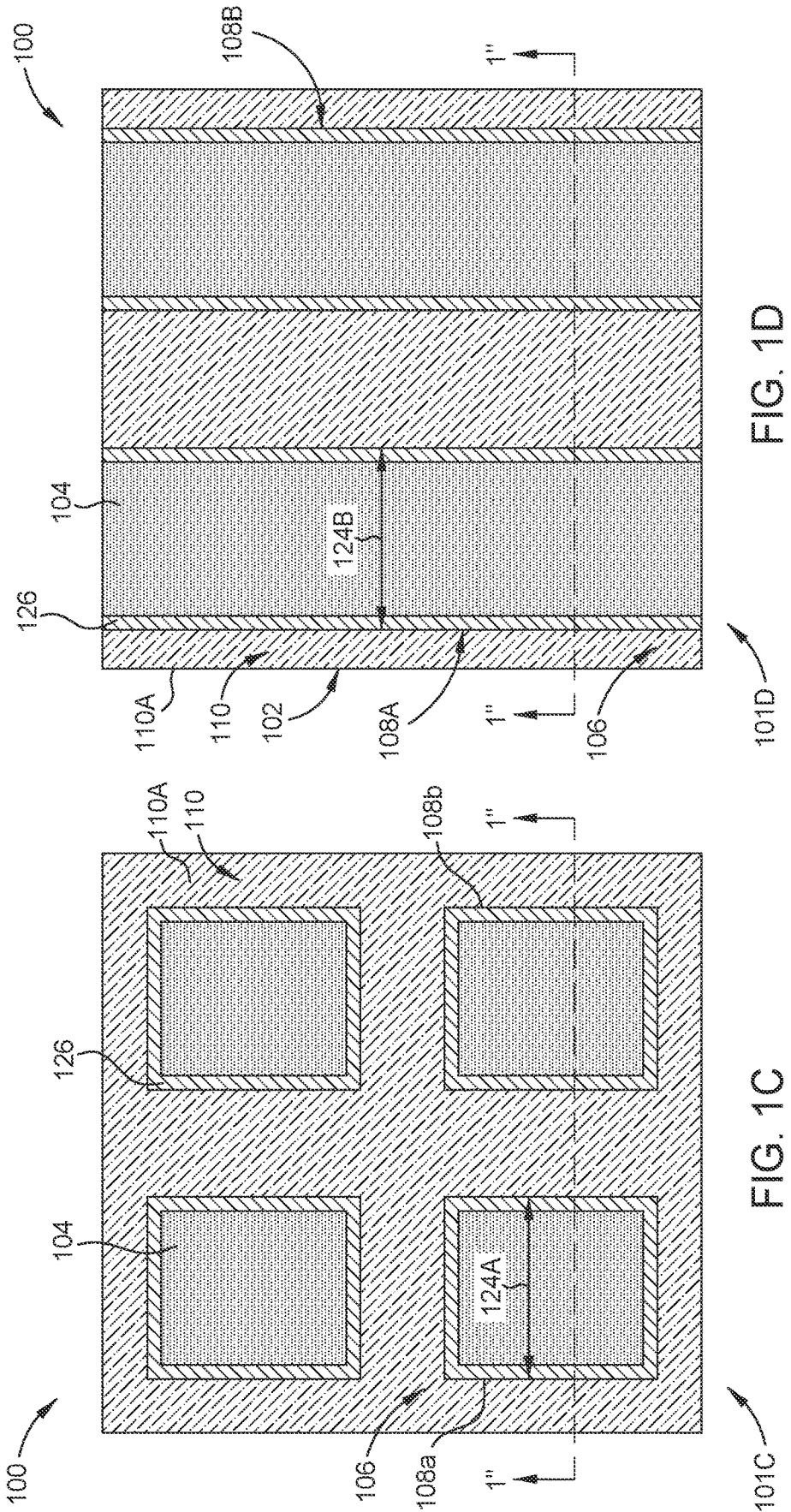
FIGS. 1C and 1D are schematic, top sectional view of a sub-pixel circuit according to embodiments.

FIG. 1C is a schematic, top sectional view of a sub-pixel circuit 100 having a dot-type architecture 101C. The dot-type architecture 101C may correspond to the first or third exemplary embodiments of the sub-pixel circuit 100. FIG. 1D is a schematic, cross-sectional view of a sub-pixel circuit 100 having a line-type architecture 101D. The line-type architecture 101D may correspond to the second or fourth exemplary embodiments of the sub-pixel circuit 100. Each of the top sectional views of FIGS. 1C and 1D are taken along section line 1'-1' of FIGS. 1A and 1B.

The dot-type architecture 101C includes a plurality of pixel openings 124A. Each of pixel opening 124A is surrounded by metal-containing overhang structures 110 that define each of the sub-pixels 106 of the dot-type architecture 101C. The line-type architecture 101D includes a plurality of pixel openings 124B. Each of pixel opening 124B is abutted by metal-containing overhang structures 110 that define each of the sub-pixels 106 of the line-type architecture 101D.

FIG. 2 is a schematic, cross-sectional view of a metal-containing overhang structure 110 of a sub-pixel circuit 100 taken along section line 2-2 of FIGS. 1A and 1B. The upper portion 110B includes an underside edge 206 and an overhang vector 208. The underside edge 206 extends past the sidewall 111 of the lower portion 110A such that the metal-containing overhang structures 110a extend over a portion of the OLED material 112 and the cathode 114. The shadowing of the overhang 109 provides for evaporation deposition each of the OLED material 112 and the cathode 114, and in some embodiments, the first capping layer 121 and/or the second capping layer 123. Each metal-containing overhang structure 110 includes is defined by an overhang width 203 and an overhang depth 205 of the overhang 109. The overhang width 203 is from the sidewall 111 of the PDL structure 126 and the underside edge 206, i.e., exterior edge, of the underside of the metal-containing overhang structure 110. The overhang depth 205 is from the anode to the underside edge 206, i.e., exterior edge, of the metal-containing overhang structure 110. An aspect ratio of the overhang width 203 to the overhang depth 205 is about 1:1 or greater. In some embodiments, which can be combined with other embodiments described herein, the aspect ratio is 2:1.

The overhang vector 208 is defined by the underside edge 206 and the PDL structure 126. The OLED material 112 is disposed over the anode and over a shadow portion 210 of the PDL structure 126. The OLED material 112 forms an OLED angle $\theta_{OLED}$ between an OLED vector 212 and the overhang vector 208. The OLED vector 212 is defined by an OLED edge 214 extending under the upper portion 110B and the underside edge 206 of the upper portion 110B. In one embodiment, which can be combined with other embodiments described herein, a HIL 204 of the OLED material 112 included. In the embodiment including the HIL 204, the OLED material 112 includes the HTL, the EML, and the ETL. The HIL 204 forms an HIL angle $\theta_{HIL}$ between a HIL vector 216 and the overhang vector 208. The HIL vector 216 is defined by an HIL edge 218 extending under the upper portion 110B and the underside edge 206 of the upper portion 110B.

The cathode 114 is disposed on the OLED material 112 and over the shadow portion 210 of the PDL structure 126. In some embodiments, which can be combined with other embodiments described herein, the cathode 114 does not contact the sidewall 111 of the lower portion 110A. In other embodiments, which can be combined with other embodiments described herein, the cathode 114 is disposed on a portion of the sidewall 111 of the lower portion 110A. The cathode 114 forms a cathode angle $\theta_{cathode}$ between a cathode vector 224 and the overhang vector 208. The cathode vector 224 is defined by a cathode edge 226 at least extending under the upper portion 110B and the underside edge 206 of the upper portion 110B. The encapsulation layer 116 is disposed over the cathode 114 (and OLED material 112) with the encapsulation layer 116 extends at least under the upper portion 110B of the metal-containing overhang structure 110 and along the sidewall 111 of the lower portion 110A.

During evaporation deposition of the OLED material 112, the underside edge 206 of the upper portion 110B defines the position of the OLED edge 214. E.g., the OLED material 112 is evaporated at an OLED maximum angle that corresponds to the OLED vector 212 and the underside edge 206 ensures that the OLED material 112 is not deposited past the OLED edge 214. In embodiments with the HIL 204, the underside edge 206 of the upper portion 110B defines the position of the HIL edge 218. E.g., the HIL 204 is evaporated at an HIL maximum angle that corresponds to the HIL vector 216 and the underside edge 206 ensures that HIL 204 is not deposited past the HIL edge 218. During evaporation deposition of the cathode 114, the underside edge 206 of the upper portion 110B defines the position of the cathode edge 226. E.g., the cathode 114 is evaporated at a cathode maximum angle that corresponds to the cathode vector 224 and the underside edge 206 ensures that the cathode 114 is not deposited past the cathode edge 226. The OLED angle $\theta_{OLED}$ is less than the cathode angle $\theta_{cathode}$. The HIL angle $\theta_{HIL}$ is less than the OLED angle $\theta_{OLED}$.

Figure 3:
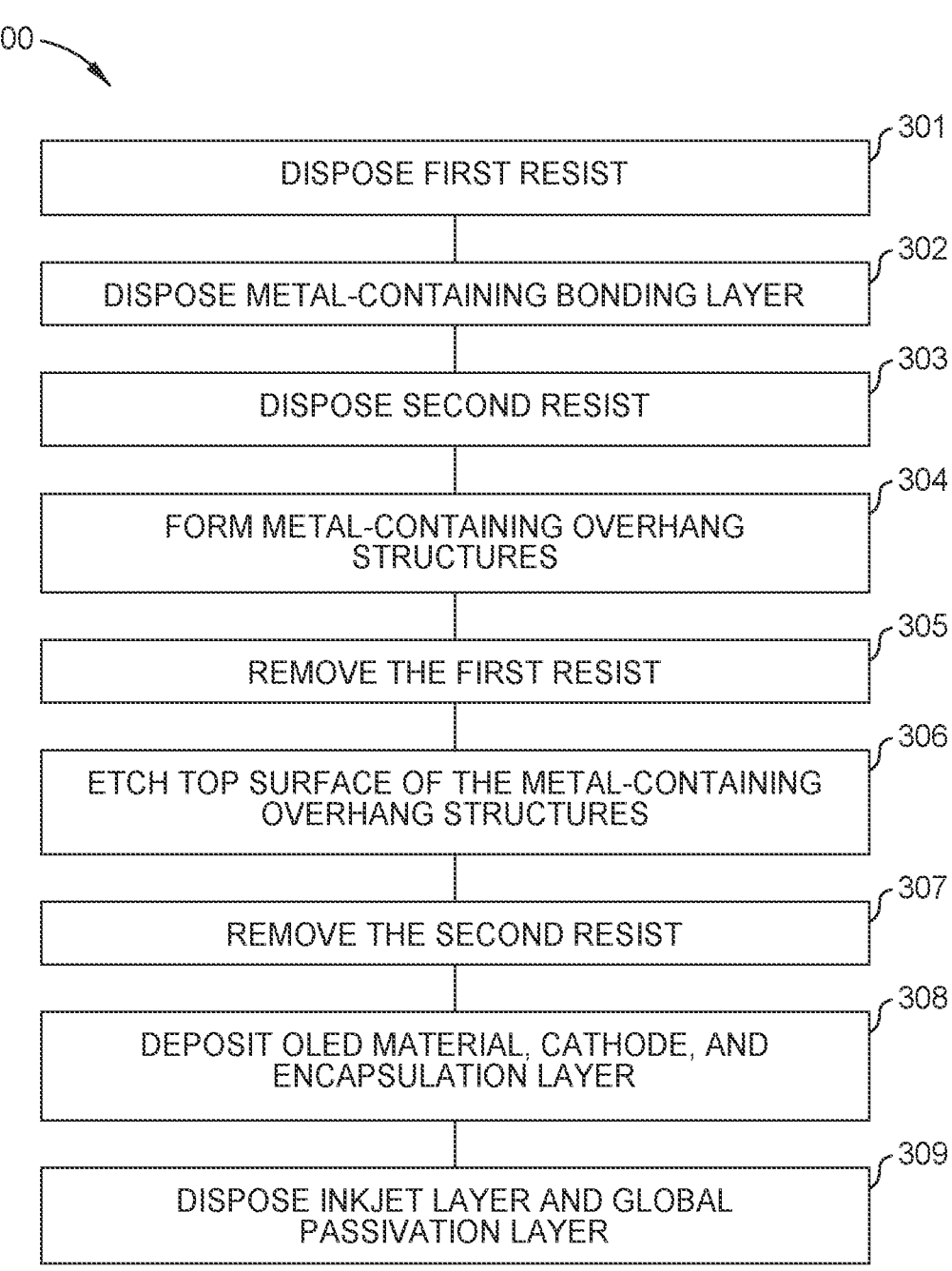
FIG. 3 is a flow a flow diagram of a method for forming a sub-pixel circuit according to embodiments.

FIG. 3 is a flow a flow diagram of a method 300 for forming a sub-pixel circuit 100. The method 300 may be utilized to fabricate a sub-pixel circuit 100 of one of the first, second, third, or fourth exemplary embodiments. FIGS. 4A-4G are schematic, cross-sectional views of a portion 400 of the substrate 102 during the method 300 for forming the sub-pixel circuit 100 according embodiments described herein. The portion 400 corresponds to a sub-pixel 106, such as a first sub-pixel 108a, of the sub-pixel circuit 100

Figures 4A, 4B:
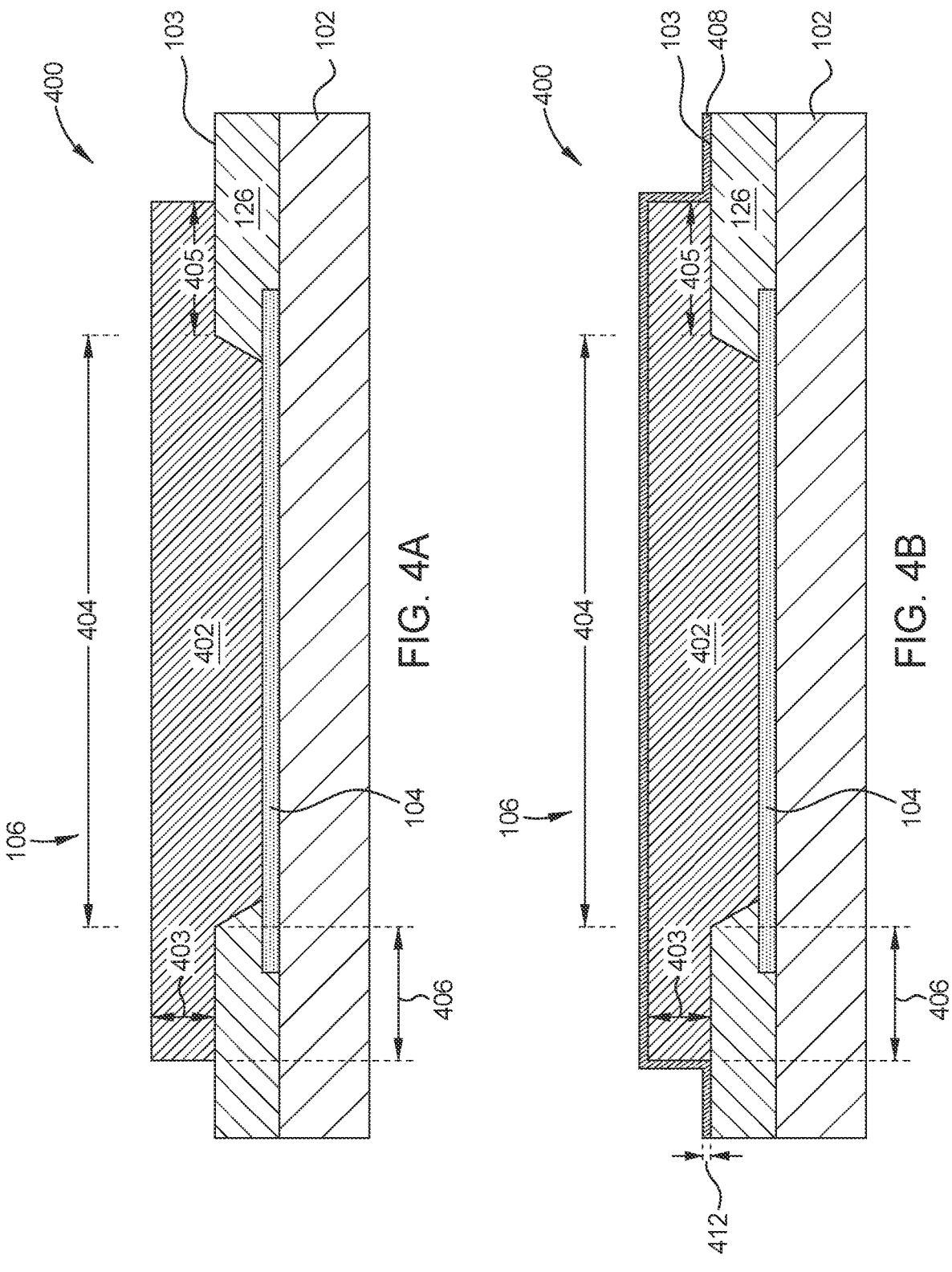
FIGS. 4A-4G are schematic, cross-sectional views of a portion of a substrate during a method for forming the sub-pixel circuit according embodiments.

At operation 301, as shown in FIG. 4A, a first resist 402 is disposed. The first resist 402 is disposed in a pixel opening 404 and over an exterior portion 406 of adjacent PDL structures 126. The pixel opening 404 corresponds to the pixel opening 124A, 124B defined by adjacent PDL structures 126. A thickness 403 of the first resist 402 disposed over the exterior portion 406 defines the overhang depth 205 of the metal-containing overhang structures 110 to be formed. The first resist 402 is disposed over the substrate 102 and patterned such that the first resist 402 is disposed in the pixel opening 404 and over the exterior portion 406. The first resist 402 (including the second resist 410) is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the resist determines whether the resist is a positive resist or a negative resist.

At optional operation 302, a metal-containing bonding layer 408 is disposed. The metal-containing bonding layer 408 is disposed over the first resist 402 and the exterior portion 406 of the adjacent PDL structures 126. The metal-containing bonding layer 408 has a thickness 412, such as 100 nm. The metal-containing bonding layer 408 includes, but is not limited to, copper, titanium, aluminum, molybdenum, silver, indium tin oxide, indium zinc oxide, or a combination thereof. In one embodiment, which can be combined with other embodiments described herein, the metal-containing bonding layer 408 may include a same composition, i.e., the same material, as the metal-containing overhang structures 110. The metal-containing bonding layer 408 is deposited via sputtering. In another embodiment, which can be combined with other embodiments described herein, the metal-containing bonding layer 408 may include a different composition, i.e., a different material, than the metal-containing overhang structures 110.

Figures 4C, 4D:
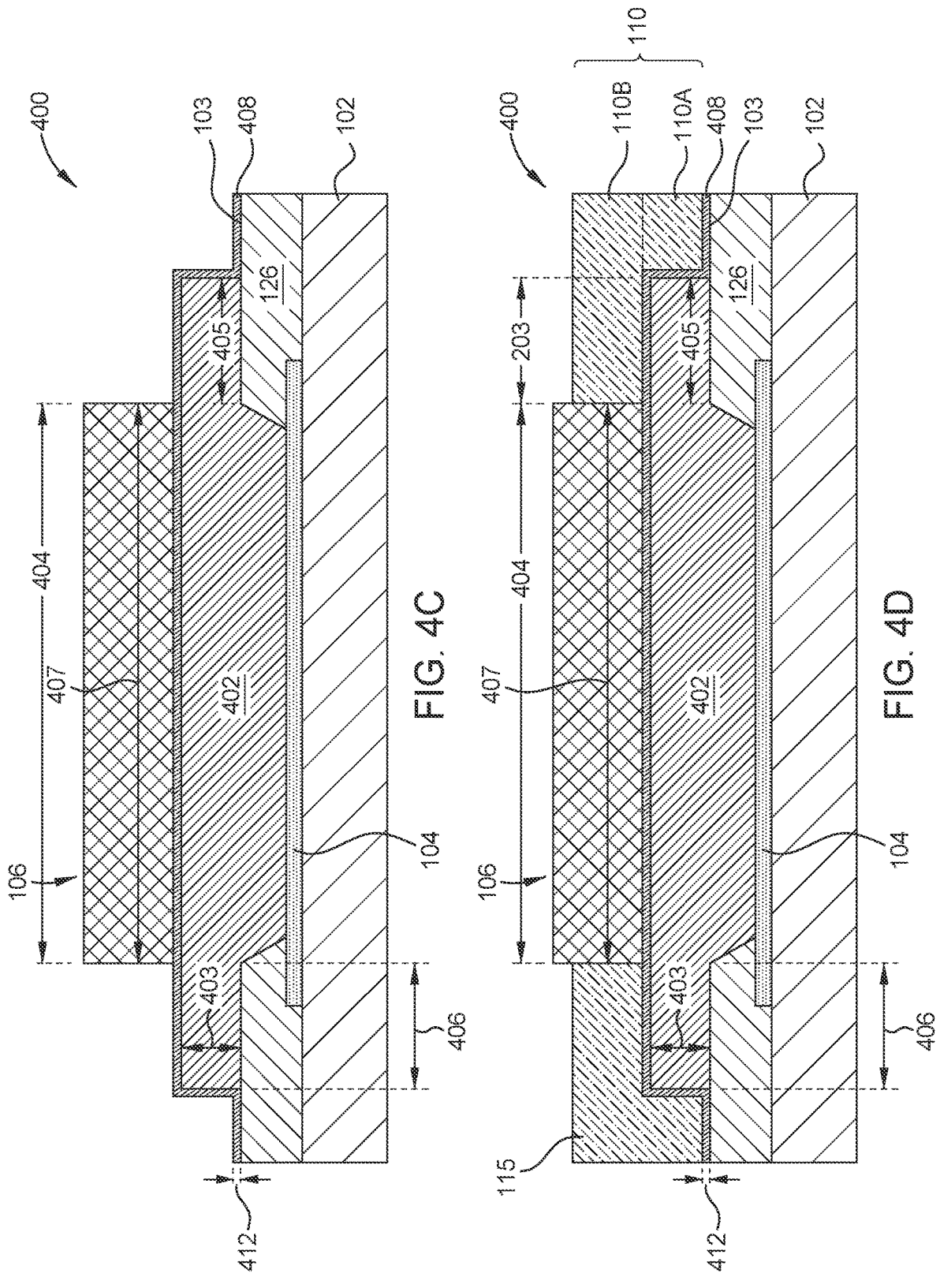

At operation 303, as shown in FIG. 4C, a second resist 410 is disposed. The second resist 410 is disposed over the first resist 402. In embodiments with the metal-containing bonding layer 408, the second resist 410 is disposed on the metal-containing bonding layer 408. The second resist 410 is disposed between the exterior portions 406 of the PDL structures 126. A second width 407 of the second resist 410 and a first width 405 of the first resist 402 disposed over the exterior portion 406 define the overhang width 203 of the metal-containing overhang structures 110 to be formed. The second resist 410 402 is disposed over the substrate 102 and patterned such that second resist 410 is disposed between the exterior portions 406 of the PDL structures 126 with the second width 407.

Figures 4E, 4F:
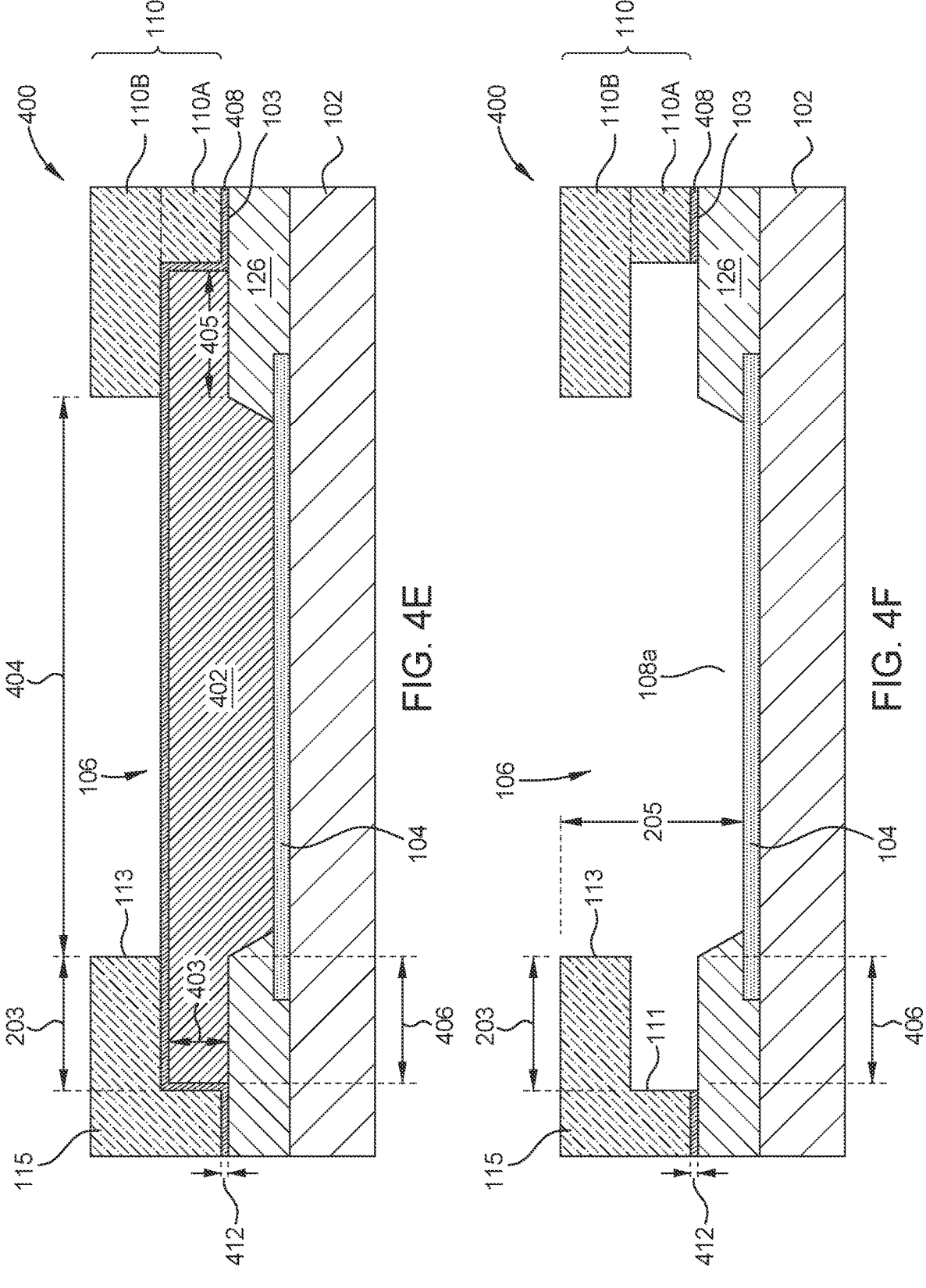
Figure 4G:
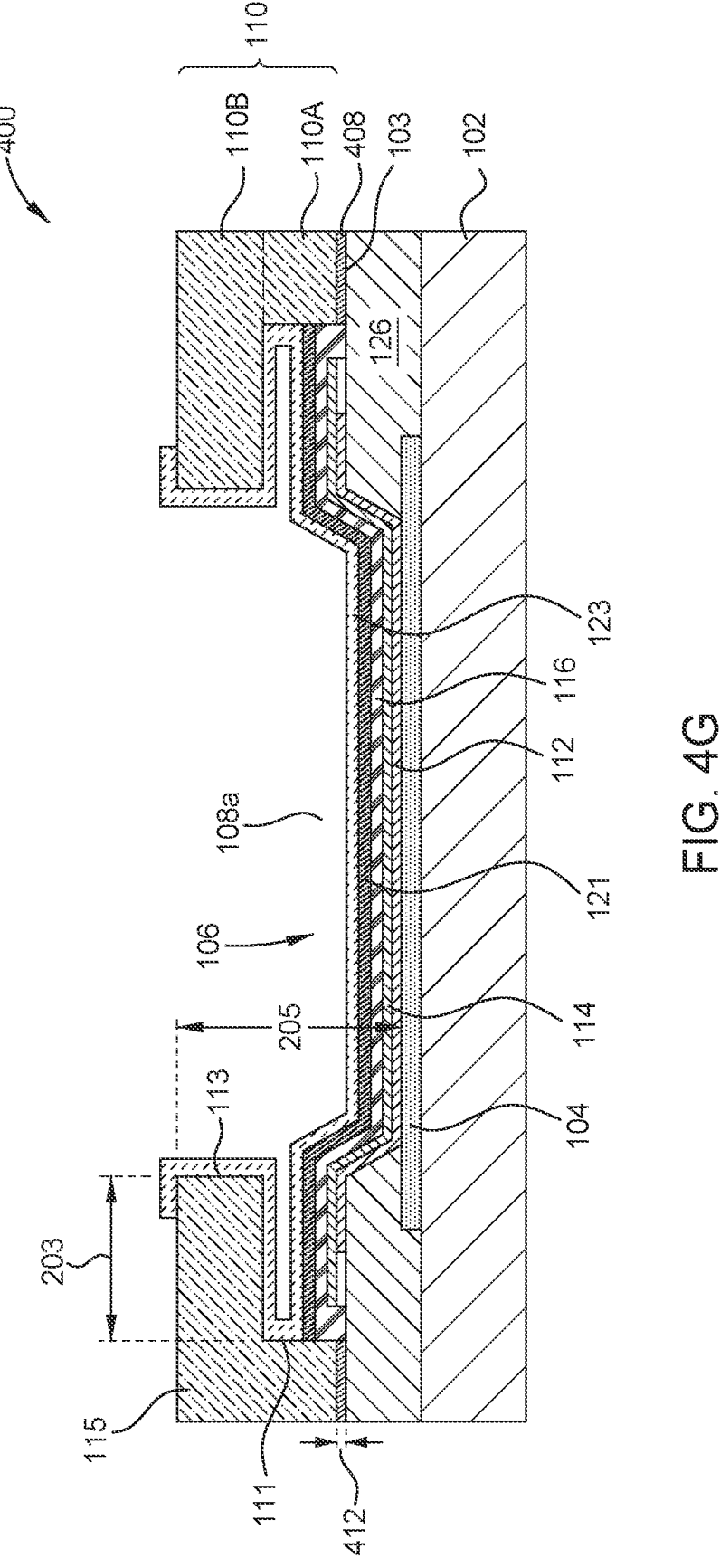

At operation 304, as shown in FIG. 4D, the metal-containing overhang structures 110 are formed. The metal-containing overhang structures 110 are formed by metal plating deposition of the metal-containing material over an area 409 defined by the first resist 402 and the second resist 410. At operation 305, as shown in FIG. 4E, the first resist 402 is removed. In embodiments with the metal-containing bonding layer 408, the metal-containing bonding layer 408 disposed on the first resist 402 is removed. The metal-containing bonding layer 408 may remain on the PDL structures 126. The second resist 410 may be removed by photoresist stripping.

At optional operation 306, as shown in FIG. 4E, the top surface 115 of the upper portion 110B the metal-containing overhang structures 110 are etched to the overhang depth 205. In other embodiments, the thickness 403 of the first resist 402 and the thickness of the second resist 410 define the overhang depth 205 of the metal-containing overhang structures 110. At operation 307, as shown in FIG. 4F, the second resist 410 is removed. The second resist 410 may be removed by photoresist stripping. Operations 301-307 described herein form the metal-containing overhang structures 110 of the sub-pixel circuit 100 including at least two sub-pixels 106, e.g., the first sub-pixel 108a, the second sub-pixel 108b, a third sub-pixel, and a fourth sub-pixel.

At operation 308, the OLED material 112, the cathode 114, and the encapsulation layer 116 are deposited. In embodiments including capping layers, the capping layers are deposited between the cathode 114 and the encapsulation layer 116. The capping layers may be deposited by evaporation deposition. The shadowing of the overhang 109 provides for evaporation deposition each of the OLED material 112 and the cathode 114, and in some embodiments, the first capping layer 121 and/or the second capping layer 123. As further discussed in the corresponding description of FIG. 2, the shadowing effect of the metal-containing overhang structures 110 define the OLED angle $\theta_{OLED}$ (shown in FIG. 2) of the OLED material 112 and the cathode angle $\theta_{cathode}$ (shown in FIG. 2) of the cathode 114. The OLED angle $\theta_{OLED}$ of the OLED material 112 and the cathode angle $\theta_{cathode}$ of the cathode 114 result from evaporation deposition of the OLED material 112 and the cathode 114.

Operation 308 may be repeated for each additional sub-pixel, e.g. for the second sub-pixel 108b, a third sub-pixel, and a fourth sub-pixel. At operation 309, the inkjet layer 118 and the global passivation layer 120 are disposed. In embodiments of the the plug arrangement 101B, plugs 122 are disposed over the encapsulation layers 116.

In summation, described herein relate to sub-pixel circuits and methods of forming sub-pixel circuits that may be utilized in a display such as an organic light-emitting diode (OLED) display. The adjacent metal-containing overhang structures defining each sub-pixel of the sub-pixel circuit of the display provide for formation of the sub-pixel circuit using evaporation deposition and provide for the metal-containing overhang structures to remain in place after the sub-pixel circuit is formed (e.g., utilizing the methods of the fifth, sixth, or seventh exemplary embodiments). Evaporation deposition may be utilized for deposition of an OLED material and cathode. The metal-containing overhang structures define deposition angles, i.e., provide for a shadowing effect during evaporation deposition. The encapsulation layer of a respective sub-pixel is disposed over the cathode with the encapsulation layer extending under at least a portion of each of the adjacent metal-containing overhang structures and along a sidewall of each of the adjacent metal-containing overhang structures.

While the foregoing is directed to embodiments of the present disclosure, other and further embodiments of the disclosure may be devised without departing from the basic scope thereof, and the scope thereof is determined by the claims that follow.

What is claimed is:

1. A device, comprising:
a substrate;
adjacent pixel-defining layer (PDL) structures disposed over the substrate;
metal-containing overhang structures disposed over an upper surface of the PDL structures, each metal-containing overhang structure comprising a body and an extension, the body and the extension formed of the same metal-containing material, the extension extending beyond a sidewall of the body to form an overhang; and a plurality of sub-pixels, each sub-pixel comprising:
adjacent metal-containing overhang structures disposed over the upper surface of the adjacent PDL structures;
an anode;
an organic light-emitting diode (OLED) material disposed over the anode;
a cathode disposed over the OLED material and contacting the sidewall of the body of the adjacent metal-containing overhang structures, wherein the extension of the adjacent metal-containing overhang structures is disposed over the upper surface of the PDL structure and over the OLED material and the cathode on the upper surface under the overhang, such that the OLED material does not contact the body and the cathode contacts the body; and
an encapsulation layer disposed over the cathode and extending under each adjacent metal-containing overhang structure, along a sidewall of each adjacent metal-containing overhang structure, and over an upper surface of each adjacent metal-containing overhang structure, the encapsulation layer of each sub-pixel being discontinuous from the encapsulation layer of an adjacent sub-pixel.

2. The device of claim 1, further comprising an encapsulation layer disposed over the cathode.

3. The device of claim 2, wherein each sub-pixel further comprises a plug disposed over the encapsulation layer, the plug having a plug transmittance that is matched or substantially matched to an OLED transmittance of the OLED material.

4. The device of claim 3, wherein the plug comprises a photoresist, a color filter, or a photosensitive monomer material.

5. The device of claim 2, further comprising a global passivation layer disposed over the metal-containing overhang structures and the encapsulation layer.

6. The device of claim 1, wherein adjacent overhangs of the metal-containing overhang structures are each overhang defined by:
an overhang width from a sidewall of a PDL structure and an exterior edge of an underside of a metal-containing overhang structure; and
an overhang depth from the anode to the underside of the metal-containing overhang structure.

7. The device of claim 6, wherein an aspect ratio of the overhang width to the overhang depth is about 1:1 or greater.

8. The device of claim 1, wherein the metal-containing overhang structures comprise copper, titanium, aluminum, molybdenum, silver, indium tin oxide, indium zinc oxide, or combinations thereof.

9. The device of claim 1, wherein the device comprises a dot-type architecture or a line-type architecture.

10. The device of claim 1, wherein the substrate is a pre-patterned indium tin oxide (ITO) glass substrate.

11. The device of claim 1, wherein the OLED material comprises a hole injection layer (HIL), a hole transport layer (HTL), an emissive layer (EML), and an electron transport layer (ETL).

12. The device of claim 1, wherein the encapsulation layer extends under the extension and along the sidewall of the body.

13. A device comprising a plurality of sub-pixels, each sub-pixel of the plurality of sub-pixels defined by adjacent pixel-defining layer (PDL) structures and adjacent metal-containing overhang structures disposed over the adjacent PDL structures, each sub-pixel having an anode, organic light-emitting diode (OLED) material disposed over the anode, a cathode disposed over the OLED material, and an encapsulation layer disposed over the cathode, wherein the device is made by a process comprising:

depositing the OLED material using deposition over a substrate, the OLED material disposed over the anode, the OLED material having an OLED edge defined by defined by adjacent overhangs of the metal-containing overhang structures, each metal-containing overhang structure comprising a body and an extension, the body and extension formed of the same metal-containing material, the extension extending beyond a sidewall of the body to form an overhang;

depositing the cathode using deposition, wherein the cathode contacts the sidewall of the body of the adjacent metal-containing overhang structures of a respective sub-pixel and the extension extends over a portion of the OLED material and the cathode, such that the OLED material does not contact the body and the cathode contacts the body; and depositing the encapsulation layer using deposition, the encapsulation layer disposed over the cathode and extending under each adjacent metal-containing overhang structure, along a sidewall of each adjacent metal-containing overhang structure, and over an upper surface of each adjacent metal-containing overhang structure, the encapsulation layer of each sub-pixel being discontinuous from the encapsulation layer of an adjacent sub-pixel.

14. The device of claim 13, wherein adjacent overhangs of the metal-containing overhang structures are each overhang defined by:

an overhang width from a sidewall of a PDL structure and an exterior edge of an underside of a metal-containing overhang structure; and an overhang depth from the anode to the underside of the metal-containing overhang structure.

15. The device of claim 14, wherein an aspect ratio of the overhang width to the overhang depth is about 1:1 or greater.

16. The device of claim 13, wherein the metal-containing overhang structures comprise copper, titanium, aluminum, molybdenum, silver, indium tin oxide, indium zinc oxide, or combinations thereof.

17. A method, comprising:

disposing a first resist in a pixel opening and over exterior portions of adjacent PDL structures, the adjacent PDL structures disposed over a substrate;

disposing a second resist on the first resist between the exterior portions of the adjacent PDL structures;

plating a metal-containing material over an area defined by the first resist and the second resist; and removing the second resist and the first resist to form metal-containing overhang structures disposed over the adjacent PDL structure.

18. The method of claim 17, further comprising sputtering a metal-containing bonding layer over the first resist and exposed portions of the adjacent PDL structures.

19. The method of claim 18, wherein the metal-containing bonding layer disposed over the first resist is removed.

20. The method of claim 17, further comprising:

depositing an OLED material using evaporation deposition over the substrate, the OLED material disposed over an anode of the substrate; and depositing a cathode over the OLED material, wherein the metal-containing overhang structures define deposition angles such that both the OLED material and the cathode extend under the metal-containing overhang structures.

* * * * *